(12) United States Patent
Chang et al.

(10) Patent No.: US 11,821,697 B2
(45) Date of Patent: Nov. 21, 2023

(54) COMPOSITE HEAT DISSIPATION DEVICE AND PREPARATION METHOD AND APPLICATIONS THEREOF

(71) Applicant: NATIONAL TSING HUA UNIVERSITY, Hsinchu (TW)

(72) Inventors: Sih-Wei Chang, Hsinchu (TW); Yen-Jen Chen, Hsinchu (TW); De-hui Wan, Hsinchu (TW); Hsuen-Li Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 86 days.

(21) Appl. No.: 17/747,880

(22) Filed: May 18, 2022

(65) Prior Publication Data
US 2023/0132949 A1  May 4, 2023

(30) Foreign Application Priority Data
Oct. 29, 2021  (TW) .................................. 110140179

(51) Int. Cl.
*F28F 21/00* (2006.01)
*F28F 13/00* (2006.01)

(52) U.S. Cl.
CPC ............ *F28F 21/00* (2013.01); *F28F 13/003* (2013.01); *F28F 2013/001* (2013.01)

(58) Field of Classification Search
CPC ... F28D 21/00; F28D 13/003; F28D 2013/001
See application file for complete search history.

(56) References Cited

U.S. PATENT DOCUMENTS

2022/0381524 A1* 12/2022 Mandal .................... B60H 1/22

* cited by examiner

*Primary Examiner* — Devon Russell
(74) *Attorney, Agent, or Firm* — Chun-Ming Shih; LANWAY IPR SERVICES

(57) ABSTRACT

A composite heat dissipation device includes an electromagnetic radiation dissipation pile including a polar dielectric material assembly including a plurality of polar dielectric material units. The polar dielectric material assembly is configured to interact with solar radiation. Surfaces of the polar dielectric material units each are configured to interact with the solar radiation to generate scattering of light. The polar dielectric material units each include an optical phonon configured to interact with thermal radiation to increase strength of the thermal radiation.

14 Claims, 9 Drawing Sheets

|  | $P_{rad}$ at 300K (W/m²) | $P_{rad}$ at 330K (W/m²) | $P_{rad}$ at 373K (W/m²) |
|---|---|---|---|
| h-BN | 338.4717 | 512.0148 | 860.1406 |
| SiO$_2$ | 323.7939 | 492.033 | 830.5877 |
| hBN+SiO$_2$ Porosity=0.3 vol% | 358.7212 | 544.4778 | 917.9307 |

FIG. 5

|  | $P_{rad}$ at 300K (W/m²) | $P_{rad}$ at 330K (W/m²) | $P_{rad}$ at 373K (W/m²) |
|---|---|---|---|
| $Si_3N_4$ | 297.2105 | 450.8717 | 757.9984 |
| $CaSO_4$ | 335.6018 | 507.0551 | 852.216 |
| $Si_3N_4$ + $CaSO_4$ Porosity≈0.3 vol% | 351.6772 | 534.4307 | 902.3649 |

FIG. 7

COMPOSITE HEAT DISSIPATION DEVICE AND PREPARATION METHOD AND APPLICATIONS THEREOF

BACKGROUND OF THE INVENTION

1. Technical Field

The technical field relates to heat dissipation, and more particularly relates to a composite heat dissipation device and preparation method and applications thereof.

2. Description of Related Art

Global average temperature increases gradually due to climate change. Many kinds of cooling devices are used widely and they consume a great amount of precious energy. Further, a great amount of carbon dioxide is emitted by the consumption and in turn, it causes greenhouse effect which accelerates global warming.

Heat transfer is classified into various mechanisms, such as thermal conduction, thermal convection, thermal radiation, and change of latent heat caused by phase transition. Thermal radiation shows obvious effect when both thermal conduction and thermal convection are restricted. Alternatively, thermal conduction or thermal convection occurs when thermal radiation is impossible. Regarding to both thermal radiation and thermal conduction, heat is transferred in many directions. To the contrary, heat is transferred in an upward direction in thermal convection.

However, the conventional heat dissipation device utilizes only one of thermal conduction, thermal convection, and thermal radiation.

Thus, the need for improvement still exists.

SUMMARY OF THE INVENTION

The disclosure is directed to a composite heat dissipation device for eliminating drawbacks of the conventional heat dissipation device including only thermal conduction, thermal convection, or thermal radiation being utilized, the radiative heat transfer material incapable of fulfilling need in the daytime and the material being not durable. The invention provides a composite heat dissipation device made of durable material, capable of being mass produced, various mechanisms of heat transfer including thermal radiation being included, capable of decreasing sunlight absorbed by an object, and increasing heat dissipated from the object so that the composite heat dissipation device can effectively dissipate heat from the object in the daytime with strong thermal radiation.

For achieving above and other objects, the invention provides a composite heat dissipation device, comprising an electromagnetic radiation dissipation pile including a polar dielectric material assembly including a plurality of polar dielectric material units; wherein the polar dielectric material assembly is configured to interact with solar radiation, surfaces of the polar dielectric material units each are configured to interact with the solar radiation to generate scattering of light, and the polar dielectric material units each include an optical phonon configured to interact with thermal radiation to increase strength of the thermal radiation.

In one of the exemplary embodiments, the polar dielectric material units are sub-wavelength structures.

In one of the exemplary embodiments, the sub-wavelength structures are piled to form a self-supporting structure.

In one of the exemplary embodiments, the sub-wavelength structures are piled to form a porous structure including a plurality of pores, and the solar radiation passes through the pores to interact with the polar dielectric material units.

In one of the exemplary embodiments, the sub-wavelength structures each include a plurality of nanoparticles.

In one of the exemplary embodiments, the sub-wavelength structures each are a fibrous structure having a nanometric diameter.

In one of the exemplary embodiments, the fibrous structure includes a plurality of nanoparticles.

In one of the exemplary embodiments, the polar dielectric material units each further comprise an acoustic phonon, and the acoustic phonons are configured to transfer heat therebetween.

In one of the exemplary embodiments, further comprises a heat source with the electromagnetic radiation dissipation pile disposed thereon, and a heat transfer interface disposed between the electromagnetic radiation dissipation pile and the heat source, and heat produced by the heat source transfers to the electromagnetic radiation dissipation pile through the heat transfer interface.

In one of the exemplary embodiments, heat is transferred between the acoustic phonons, the polar dielectric material units each further comprises an optical phonon, and heat is further transferred from the acoustic phonons to the optical phonons for increasing strength of the thermal radiation.

For achieving above and other objects, the invention further provides a composite heat dissipation device, comprising an electromagnetic radiation dissipation pile including a polar dielectric material assembly including a plurality of first polar dielectric material units and a plurality of second polar dielectric material units; wherein the first polar dielectric material units each includes a first optical phonon, the second polar dielectric material units each includes a second optical phonon, the first optical phonon has a resonant frequency different from that of the second optical phonon, the polar dielectric material assembly is configured to interact with solar radiation, a first thermal radiation, and a second thermal radiation respectively, surfaces of the first and second polar dielectric material units each are configured to interact with the solar radiation to generate scattering of light, the first optical phonon is configured to interact with a first thermal radiation to increase strength of the first thermal radiation, and the second optical phonon is configured to interact with a second thermal radiation to increase strength of the second thermal radiation.

In one of the exemplary embodiments, the first and second polar dielectric material units are sub-wavelength structures.

In one of the exemplary embodiments, the sub-wavelength structures are piled to form a self-supporting structure.

In one of the exemplary embodiments, the sub-wavelength structures are piled to form a porous structure including a plurality of pores, and wherein the solar radiation passes through the pores to interact with the first and second polar dielectric material units.

For achieving above and other objects, the invention further provides a method of preparing the composite heat dissipation device, the method comprising the steps of providing a polar dielectric material; uniformly grinding the polar dielectric material into powder and mixing same; putting the mixed powder in a mold; and heating the mold at a temperature less than a melting point of the polar dielectric material until a product having a self-supporting structure is produced For achieving above and other objects, the invention further provides a method of preparing the composite heat dissipation device, the method comprising the step of providing a plurality of first polar dielectric material units and a plurality of second polar dielectric material units wherein the first and second polar dielectric material units each are in black body radiation of wavelength range of spectrum, and wherein absorptance of the black body radiation of wavelength range of spectrum of the composite heat dissipation device is greater than that of each of the first and second polar dielectric material units.

The composite heat dissipation device and preparation method and applications thereof of the invention has the following advantages and benefits in comparison with the conventional art: high reflectivity with respect to solar radiation, high emissivity with respect to thermal radiation, and low thermal insulance of a material.

The above and other objects, features and advantages of the invention will become apparent from the following detailed description taken with the accompanying drawings.

BRIEF DESCRIPTION OF THE DRAWINGS

FIG. 5 is a table tabulating radiation powers of boron nitride, silicon dioxide, and a mixture of boron nitride and silicon dioxide at three different temperatures respectively;

FIG. 7 is a table tabulating radiation powers of silicon nitride, calcium sulfate, and a mixture of silicon nitride and calcium sulfate at three different temperatures respectively;

DETAILED DESCRIPTION OF THE INVENTION

Figure 1:
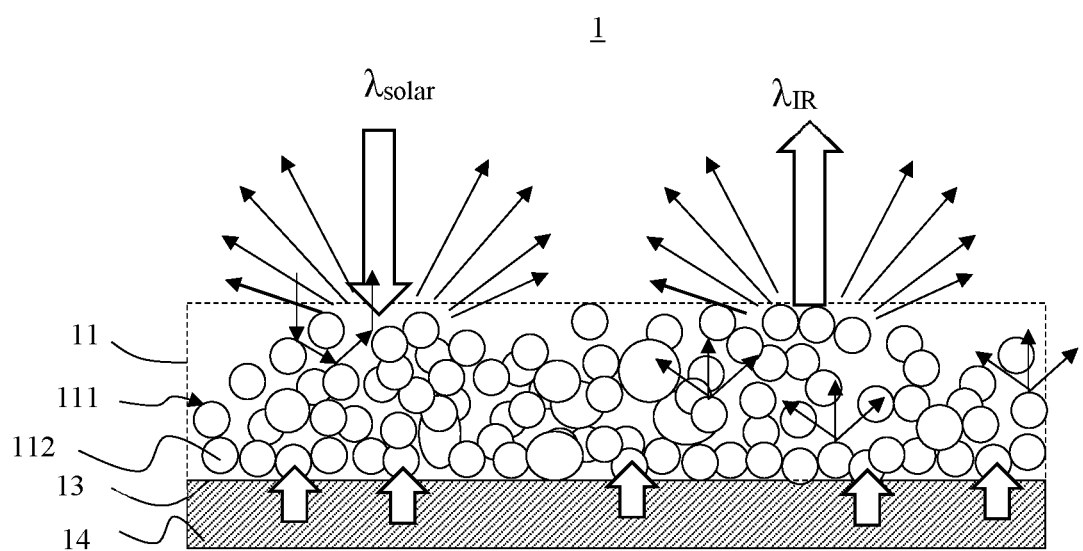
FIG. 1 is a cross-sectional view of a composite heat dissipation device according to a first preferred embodiment of the invention.

Embodiments of the invention will now be described, by way of example only, with reference to the accompanying drawings.

The invention is related to electromagnetic radiation of different wavelengths in which solar radiation means its wavelength located at any electromagnetic radiation in solar radiation wavelength range of spectrum; solar radiation wavelength range of spectrum means wavelength of 0.3 µm to 4 µm; thermal radiation means its wavelength located at any electromagnetic radiation in black body radiation wavelength range of spectrum, black body radiation wavelength range of spectrum means wavelength of about 4 µm to 25 µm, and atmospheric transparent window's wavelength range means wavelength of about 8 µm to 13 µm. It is understood that above wavelengths are exemplary, not limited. Different radiation wavelengths aim to explain principles and advantages of technical characteristics of the invention and do not aim to limit the invention to the specific wavelengths.

In the invention, diffuse reflection of material or structure means percentage of any incident electromagnetic radiation reflectively diffused from a surface. A perfect reflective body is defined as a body having 100% diffuse reflection. In the invention, high diffuse reflection means a material or structure has at least 60% diffuse reflection in a specific range, preferably, more than 80% diffuse reflection, and more preferably, more than 95% diffuse reflection.

In the invention, emissivity of a material or structure means efficacy of emitting electromagnetic radiation. A perfect black body emitter is defined as one has 100% emissivity. In the invention, high emissivity means a material or structure has at least 70% emissivity in a specific range, preferably, more than 80% emissivity, and more preferably, more than 95% emissivity.

In the invention, transmittance of a material or structure means ratio of electromagnetic wave penetrating the material or structure in a specific wavelength range. A perfect material or structure is defined as one has 100% transmittance. In the invention, high transmittance means a material or structure has about 60% transmittance in a specific range, preferably, more than 80% transmittance, and more preferably, more than 95% transmittance.

In the invention, sub-wavelength structure of a material or structure means the material or structure includes measure in at least one direction less than wavelength of electromagnetic radiation being compared. For example, measure in at least one direction is equal to or less than particle of any shape of wavelength having the maximum strength of material black body radiation, or diameter less than a structure formed of particles of any shape having the maximum strength of material black body radiation. Wavelength of a material black body radiation having the maximum strength can be obtained by calculating material temperature based on Wien's displacement law.

In the invention, radiative heat transfer layer means a material having a high energy gap and being low in absorption of solar radiation wavelength range of spectrum. For example, but not limited to, the material is oxide such as $Al_2O_3$, $ZnO$, $MgO$, $TiO_2$, $SiO_2$, $HfO_2$, or $ZrO_2$; nitride such as $AlN$, $hBN$, $cBN$, $Si_3N_4$, or $GaN$; $SiC$; metallic chloride such as $CaF_2$, $MgF_2$, or $BaF_2$; carbonate such as $CaCO_3$ or $CaMg(CO_3)_2$ having $CO_3^{2-}$; sulfate such as $BaSO_4$ or $CaSO_4$ having $SO_4^{2-}$; or phosphate having $PO_4^{3-}$.

In the invention, optical phonons are out-of-phase movements of the atoms in the lattice, one atom moving to the left, and its neighbor to the right. This occurs if the lattice basis consists of two or more atoms. They are called optical because in ionic crystals, such as sodium chloride, fluctuations in displacement create an electrical polarization that couples to the electromagnetic field. Hence, they can be excited by infrared radiation, the electric field of the light will move every positive sodium ion in the direction of the field, and every negative chloride ion in the other direction, causing the crystal to vibrate. Acoustic phonons are coherent movements of atoms of the lattice out of their equilibrium positions. If the displacement is in the direction of propagation, then in some areas the atoms will be closer, in others farther apart, as in a sound wave in air (hence the name acoustic). Displacement perpendicular to the propagation direction is comparable to waves on a string. If the wavelength of acoustic phonons goes to infinity, this corresponds to a simple displacement of the whole crystal, and this costs zero deformation energy. Acoustic phonons exhibit a linear relationship between frequency and phonon wave-vector for long wavelengths. The frequencies of acoustic phonons tend to zero with longer wavelength. Optical phonons have a non-zero frequency at the Brillouin zone center and show no dispersion near that long wavelength limit. This is because they correspond to a mode of vibration where positive and negative ions at adjacent lattice sites swing against each other, creating a time-varying electrical dipole moment.

Figure 2:
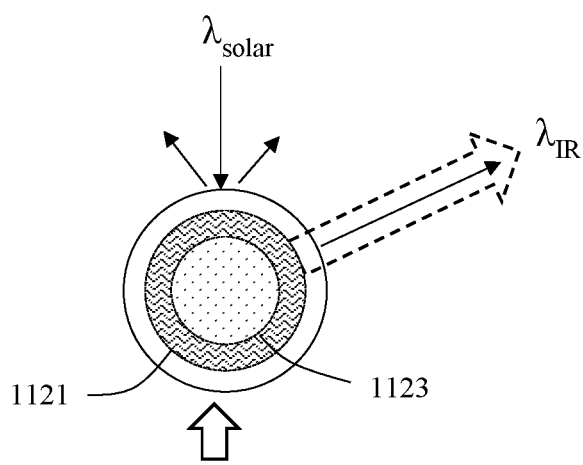
FIG. 2 schematically depicts the polar dielectric material unit of the composite heat dissipation device of the first preferred embodiment.

Referring to FIGS. 1 and 2 in which FIG. 1 is a cross-sectional view of a composite heat dissipation device 1 according to a first preferred embodiment of the invention, and FIG. 2 schematically depicts the polar dielectric material unit 12 of the composite heat dissipation device 1 of first preferred embodiment. Details thereof are discussed below.

The composite heat dissipation device 1 comprises an electromagnetic radiation dissipation pile 11. The electromagnetic radiation dissipation pile 11 interacts with both solar radiation $\lambda_{solar}$ and thermal radiation $\lambda_{IR}$. The electromagnetic radiation dissipation pile 11 interacts differently with different wavelength ranges of electromagnetic radiation, i.e., having different optical characteristics at different electromagnetic radiation wavelength ranges. The electromagnetic radiation dissipation pile 11 has high diffuse reflection at thermal radiation wavelength range of spectrum, and has high emissivity at black body radiation wavelength range of spectrum. The electromagnetic radiation dissipation pile 11 includes a polar dielectric material assembly 111 including a plurality of polar dielectric material units 112. Scattering of light is generated when the solar radiation $\lambda_{solar}$ interacts with the polar dielectric material units 112. The polar dielectric material unit 112 includes an optical phonon 1121 which interacts with thermal radiation $\lambda_{IR}$ to increase strength of thermal radiation $\lambda_{IR}$.

In the embodiment, the polar dielectric material assembly 111 includes the plurality of polar dielectric material units 112 piled as a porous structure. Pores of the porous structure allow solar radiation $\lambda_{solar}$ to pass through. The solar radiation $\lambda_{solar}$ interacts with the polar dielectric material units 112 to scatter light. In detail, the solar radiation $\lambda_{solar}$ enters the composite heat dissipation device 1 onto the polar dielectric material units 112 to scatter light from the surface of the polar dielectric material units 112. In detail, the solar radiation $\lambda_{solar}$ enters the composite heat dissipation device 1 to contact the surfaces of the polar dielectric material units 112, thereby scattering light from the surfaces of the polar dielectric material units 112. Scattering of light occurs in many different directions. The solar radiation $\lambda_{solar}$ can cause many times of scattering of light on the polar dielectric material units 112. In the invention, the porous structure of the polar dielectric material assembly 111 causes the solar radiation $\lambda_{solar}$ to generate high diffuse reflection. It is understood that the porous structure of the polar dielectric material units 112 may be tidy or untidy as long as the pores of the porous structure have high diffuse reflection. This is within the scope of the invention.

In the embodiment, the solar radiation $\lambda_{solar}$ can generate high diffuse reflection in the pores of the porous structure. Further, the pores can adjust equivalent optical constant of the polar dielectric material assembly 111. Increasing sizes of the pores of the porous structure can decrease the equivalent optical constant of the polar dielectric material assembly 111. Emissivity of the thermal radiation $\lambda_{IR}$ can be increased by decreasing both density of the particles of the pile and pore ratio. It is understood that in other embodiments for achieving above objects, it is possible to fill matters having reflectivity lower than that of the polar dielectric material units 112 so as to adjust the equivalent optical constant of the electromagnetic radiation dissipation pile 11.

In the invention, size of the polar dielectric material unit 112 is sub-wavelength structure. The sub-wavelength structure is defined as a particle of any shape having a measure in at least one direction equal to or less than the wavelength of electromagnetic radiation or a fiber of any shape having a diameter equal to or less than the wavelength of electromagnetic radiation. The wavelength of the electromagnetic radiation is defined as wavelength of material black body radiation having the maximum strength. The sub-wavelength structure is, but not limited to, a nanoparticle having a diameter between 50 nm and 8000 nm, and preferably, between 100 nm and 2000 nm. It is understood that in other embodiments, the polar dielectric material unit 112 is defined as a fibrous structure having a nanometric diameter or a fibrous structure having a plurality of nanoparticles. In the invention, it is not required to have all polar dielectric material units 112 to be the same size as long as the polar dielectric material assembly 111 includes a predetermined number of polar dielectric material units 112 having the characteristic of sub-wavelength structure. This is within the scope of the invention.

As shown in FIG. 2 specifically, it schematically depicts the polar dielectric material unit 112 of the composite heat dissipation device 1 interacting with both the solar radiation $\lambda_{solar}$ and the thermal radiation $\lambda_{IR}$.

The surface the polar dielectric material unit 112 is provided with the plurality of light scattering units 11 because the fibrous structure has a high percentage of surface area. Diffusion in many different directions is generated from the polar dielectric material unit 112 when the thermal radiation $\lambda_{solar}$ falls on the surface of the polar dielectric material unit 112. In the invention, the polar dielectric material unit 112 is a material having high energy gap. The polar dielectric material unit 112 absorbs little solar radiation from solar radiation wavelength range of spectrum and generates high diffuse reflection. In the invention, the sub-wavelength structural polar dielectric material unit 112 includes an optical phonon 1121. The optical phonon 1121 is generated when vibration of atoms in a lattice causes change of relative positions of the atoms. It is resonance when dipole between different atoms couples with electromagnetic wave of a specific frequency. It is useful to extract the optical phonon 1121 from a resonant wavelength range. The optical phonon 1121 can increase emissivity of electromagnetic wave. In the embodiment, resonance is generated when the optical phonon 1121 interacts with thermal radiation $\lambda_{IR}$ of specific frequency. The optical phonon 1121 can increase strength of the thermal radiation $\lambda_{IR}$ of a specific frequency. In the invention, in comparison with polymer, the polar dielectric material units 112 have a great density of the optical phonons 1121. Further, with respect to the thermal radiation $\lambda_{IR}$ of the specific frequency, the polar dielectric material unit 112 has greater radiant energy strength in comparison with polymer.

As shown in FIG. 2 again, the polar dielectric material unit 112 further comprises an acoustic phonon 1123. The acoustic phonon 1123 means that the out-of-phase movements of the atoms in the lattice are without change of relative positions of atoms. The acoustic phonon 1123 can interacts with heat. That is, heat can be effectively transferred between different ones of the polar dielectric material units 112. The acoustic phonon 1123 increases heat transfer efficiency so that thermal resistance of the polar dielectric material assembly 111 can be decreased. The polar dielectric material unit 112 can transfer heat to the acoustic phonon 1123 which in turn radiates extracted thermal radiation $\lambda_{IR}$ of a resonant wavelength range. As a result, strength of the thermal radiation $\lambda_{IR}$ of a specific frequency is greatly increased.

As shown in FIG. 1 specifically, the composite heat dissipation device 1 is provided on a heat source 14, and a heat transfer interface 13 is provided between the electromagnetic radiation dissipation pile 11 and the heat source 14. Heat produced by the heat source 14 transfers to the electromagnetic radiation dissipation pile 11 through the heat transfer interface 13. Specifically, portions of the polar dielectric material units 112 of the electromagnetic radiation dissipation pile 11 are in direct contact with the heat transfer interface 13. Thus, heat can be transferred from the heat transfer interface 13 to the polar dielectric material units 112. Heat absorbed by one polar dielectric material unit 112 can transfer to other polar dielectric material units 112 by the acoustic phonon 1123.

Thermal resistance of the polar dielectric material assembly 111 is decreased to a minimum because the acoustic phonon 1123 transfers heat. Temperatures on two sides of the polar dielectric material assembly 111 decrease. The polar dielectric material unit 112 then radiates heat in the form of thermal radiation $\lambda_{IR}$ via the optical phonon 1121, thereby increasing the strength of the thermal radiation $\lambda_{IR}$ of a specific frequency. In the invention, the polar dielectric material assembly 111 transfers heat to the acoustic phonon 1123 which in turn radiates heat to decrease thermal resistance of the electromagnetic radiation dissipation pile 11. Further, the optical phonon 1121 can increase strength of the thermal radiation $\lambda_{IR}$ so that radiative heat transfer performance of the polar dielectric material assembly 111 can be increased and heat dissipated from the heat source 14 is greatly increased. In the invention, the composite heat dissipation device 1 can achieve the purposes of effective heat transfer in the form of thermal radiation.

Figure 3:
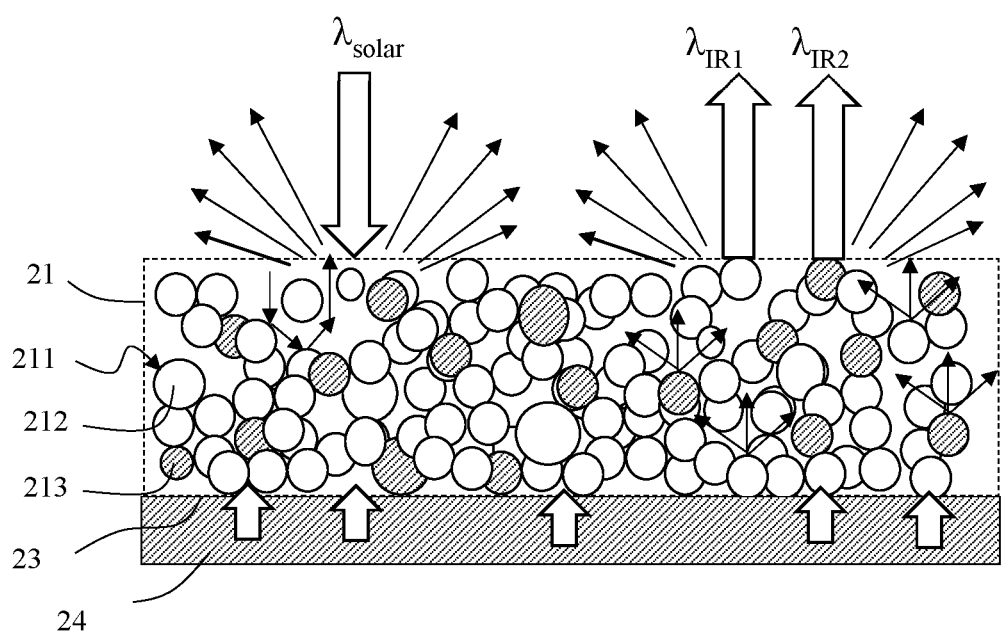
FIG. 3 is a cross-sectional view of a composite heat dissipation device according to a second preferred embodiment of the invention.

Referring to FIG. 3, it shows a cross-sectional view of a composite heat dissipation device 2 according to a second preferred embodiment of the invention. The composite heat dissipation device 2 comprises an electromagnetic radiation dissipation pile 21. The electromagnetic radiation dissipation pile 21 includes a polar dielectric material assembly 211 including a plurality of first polar dielectric material units 212 and a plurality of second polar dielectric material units 213. The electromagnetic radiation dissipation pile 21 interacts with the solar radiation $\lambda_{solar}$, a first thermal radiation $\lambda_{IR1}$, and a second thermal radiation $\lambda_{IR2}$ respectively. The first thermal radiation $\lambda_{IR1}$ and the second thermal radiation $\lambda_{IR2}$ have different wavelengths. The electromagnetic radiation dissipation pile 21 has high diffuse reflection with respect to the solar radiation $\lambda_{solar}$. The electromagnetic radiation dissipation pile 21 has high emissivity with respect to the first thermal radiation $\lambda_{IR1}$ and the second thermal radiation $\lambda_{IR2}$ respectively.

The characteristics of the second preferred embodiment are substantially the same as that of the first preferred embodiment except the following: the polar dielectric material assembly 211 is shaped as a pile having a porous structure and a self-supporting structure. Both the porous structure and the self-supporting structure include the plurality of first polar dielectric material units 212 and the plurality of second polar dielectric material units 213 shaped as a pile. The solar radiation $\lambda_{solar}$ enters the electromagnetic radiation dissipation pile 21 to cause scattering of light on surfaces of the first polar dielectric material units 212 or surfaces of the second polar dielectric material units 213. The solar radiation $\lambda_{solar}$ can cause many times of scattering of light on the surfaces of the first polar dielectric material units 212 and/or the surfaces of the second polar dielectric material units 213. The polar dielectric material assembly 211 has high diffuse reflection with respect to the solar radiation $\lambda_{solar}$. Likewise, a porous structure is formed by the first polar dielectric material units 212 and the second polar dielectric material units 213 and the porous structure of the first polar dielectric material units 212 and the second polar dielectric material units 213 may be tidy or untidy as long as the pores of the porous structure have high diffuse reflection. This is within the scope of the invention.

Figure 4:
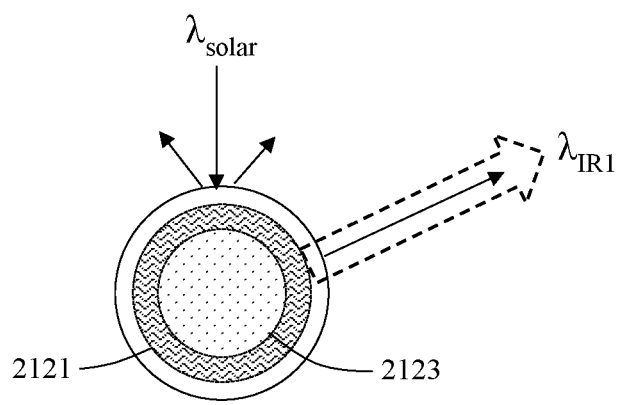
FIG. 4 schematically depicts the first polar dielectric material unit of the composite heat dissipation device of the second preferred embodiment interacting with the solar radiation $\lambda_{solar}$ and the first thermal radiation $\lambda_{IR1}$ in an upper part of the drawing sheet, and the second polar dielectric material unit of the composite heat dissipation device of the second preferred embodiment interacting with the solar radiation $\lambda_{solar}$ and the second thermal radiation $\lambda_{IR2}$ in a lower part of the drawing sheet respectively.
Figure 4:
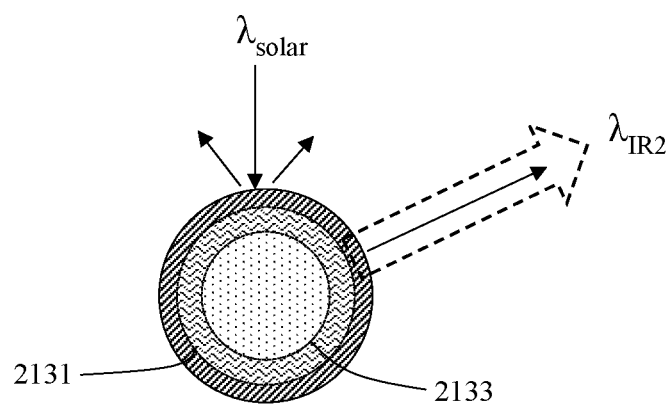

Referring to FIG. 4, it schematically depicts the first polar dielectric material unit 212 of the composite heat dissipation device 2 of the second preferred embodiment interacting with the solar radiation $\lambda_{solar}$ and the first thermal radiation $\lambda_{IR1}$ in an upper part of the drawing sheet, and the second polar dielectric material unit 213 of the composite heat dissipation device 2 of the second preferred embodiment in a lower part of the drawing sheet respectively. The first polar dielectric material unit 212 includes a first optical phonon 2121 and the second polar dielectric material unit 213 includes a second optical phonon 2131. Resonance is generated when the first optical phonon 2121 or the second optical phonon 2131 interacts with electromagnetic waves of different frequencies. In detail, in response to the incident solar radiation $\lambda_{solar}$, the first optical phonon 2121 interacts with the first thermal radiation $\lambda_{IR1}$ to generate resonance, and the second optical phonon 2131 interacts with the second thermal radiation $\lambda_{IR2}$ to generate resonance respectively. The first optical phonon 2121 can increase strength of the first thermal radiation $\lambda_{IR1}$ of a first frequency and the second optical phonon 2131 can increase strength of the second thermal radiation $\lambda_{IR2}$ of a second frequency different from the first frequency respectively. The sub-wavelength structural first polar dielectric material unit 212 further comprises a first acoustic phonon 2123 and the sub-wavelength structural second polar dielectric material unit 213 further comprises a second acoustic phonon 2133. The first acoustic phonon 2123 and the second acoustic phonon 2133 each interact with heat. In the embodiment, heat can be effectively transferred in each of the first acoustic phonon 2123 and the second acoustic phonon 2133. After heat has been effectively transferred to both the first polar dielectric material unit 212 and the second polar dielectric material unit 213, the first optical phonon 2121 radiates extracted first thermal radiation $\lambda_{IR1}$ of a resonant wavelength range, and the second optical phonon 2131 radiates extracted second thermal radiation $\lambda_{IR2}$ of the resonant wavelength range respectively. As a result, strength of the first thermal radiation $\lambda_{IR1}$ of a first specific frequency is greatly increased, and strength of the second thermal radiation $\lambda_{IR2}$ of a second specific frequency is greatly increased respectively.

As shown in FIG. 3 specifically, the composite heat dissipation device 2 is provided on a heat source 24, and a heat transfer interface 23 is provided between the electromagnetic radiation dissipation pile 21 and the heat source 24. Heat produced by the heat source 24 transfers to the electromagnetic radiation dissipation pile 21 through the heat transfer interface 23. Specifically, portions of the first polar dielectric material units 212 and portions of the second polar dielectric material units 213 are in direct contact with the heat transfer interface 23. Thus, heat can be transferred from the heat transfer interface 23 to the first polar dielectric material units 212 and the second polar dielectric material units 213 respectively. And in turn, heat absorbed by the first polar dielectric material unit 212 can transfer to other first polar dielectric material units 212 by the first acoustic phonon 2123 and heat absorbed by the second polar dielectric material unit 213 can transfer to other second polar dielectric material units 213 by the second acoustic phonon 2133 respectively.

Thermal resistance of the polar dielectric material assembly 211 is decreased to a minimum because both the first acoustic phonon 2123 and the second acoustic phonon 2133 transfer heat. Temperatures on two sides of the polar dielectric material assembly 211 decrease. The first polar dielectric material unit 212 then radiates heat in the form of thermal radiation $\lambda_{IR1}$ via the first optical phonon 2121 and the second polar dielectric material unit 213 then radiates heat in the form of thermal radiation $\lambda_{IR2}$ via the second optical phonon 2131 respectively. As a result, strength of the first thermal radiation $\lambda_{IR1}$ of a first specific frequency is greatly increased, and strength of the second thermal radiation $\lambda_{IR2}$ of a second specific frequency is greatly increased respectively. In the invention, the polar dielectric material assembly 211 transfers heat to the first acoustic phonon 2123 which in turn radiates heat, and transfers heat to the second acoustic phonon 2133 which in turn radiates heat. As a result, thermal resistance of the electromagnetic radiation dissipation pile 21 is decreased. Further, the first optical phonon 2121 can increase strength of thermal radiation $\lambda_{IR1}$, and the second optical phonon 2131 can increase strength of thermal radiation $\lambda_{IR2}$ respectively so that radiative heat transfer performance of the polar dielectric material assembly 211 can be increased and heat dissipated from the heat source 24 is greatly increased.

The composite heat dissipation device 2 includes the plurality of first polar dielectric material units 212 and the plurality of second polar dielectric material units 213. Advantages of the invention include being capable of selecting a polar dielectric material having a specific resonant wavelength range, contributing to the control of spectrum, and producing a composite heat dissipation device having a wide wavelength range by incorporating a plurality of polar dielectric materials having different optical phonon resonant wavelength ranges. It is understood that in chemical compounds, polymerization can occur via a variety of reaction mechanisms that vary in complexity due to the functional groups, including carbon, hydrogen and oxygen molecules, present in the reactants and their inherent steric effects. Peaks of characteristic wavelengths of the functional groups are very close each other. Thus, their infrared wavelength ranges overlap to form an absorption peak having a wide half-wavelength. As a result, it is difficult of utilizing the conventional polymers to produce a radiation body having a wide wavelength range and high emissivity.

Chemical compound of the first polar dielectric material unit 212 of the composite heat dissipation device 2 of the second preferred embodiment of the invention is, but not limited to, boron nitride; and chemical compound of the second polar dielectric material unit 213 of the composite heat dissipation device 2 of the second preferred embodiment of the invention is, but not limited to, silicon dioxide.

Referring to FIG. 5, it is a table tabulating radiation powers ($P_{rad}$) of boron nitride, silicon dioxide, and a mixture of boron nitride and silicon dioxide of mixing ratio of 1 to 1 and pore ratio of 0.3 at 300 K, 330 K and 373 K respectively; and the mixture of boron nitride and silicon dioxide being used for manufacturing the composite heat dissipation device having a wide wavelength range of the invention.

Figure 6:
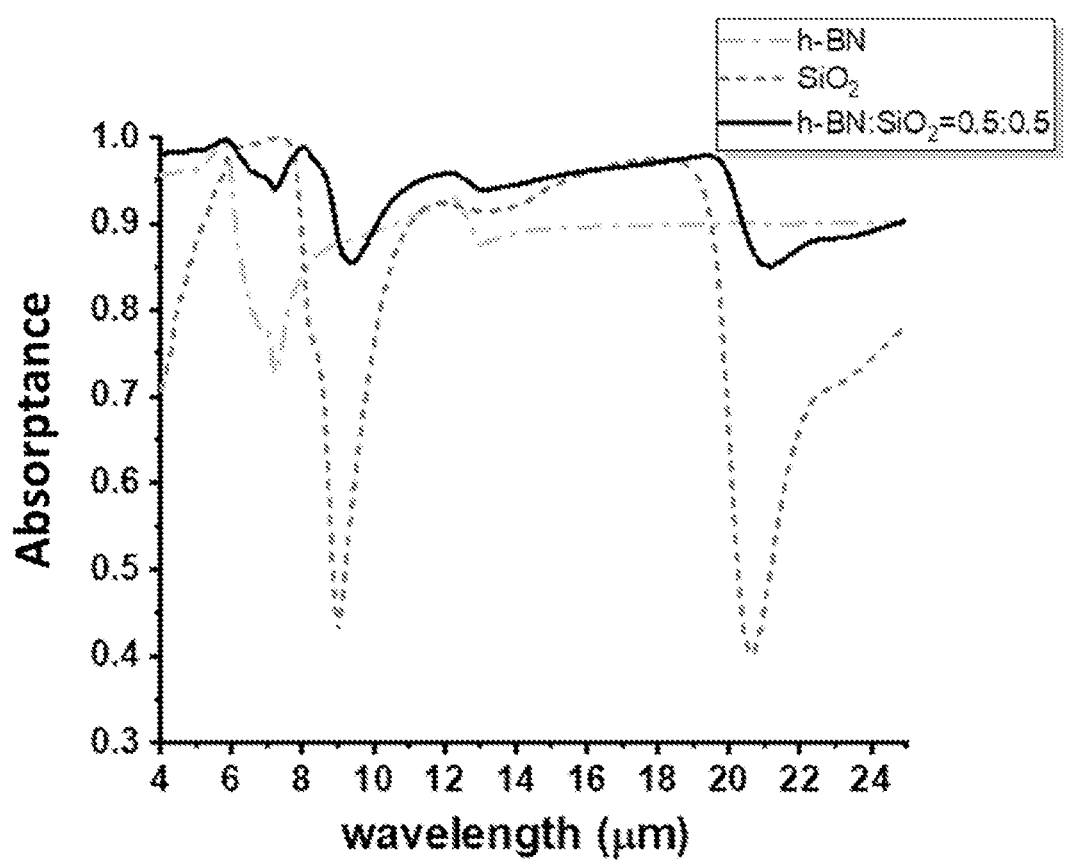
FIG. 6 is a chart showing absorptance versus wavelength for boron nitride, silicon dioxide, and a mixture of boron nitride and silicon dioxide respectively.

Referring to FIG. 6, it is a chart showing absorptance versus wavelength for boron nitride, silicon dioxide, and the mixture of boron nitride and silicon dioxide respectively in which the mixture of boron nitride and silicon dioxide has a mixing ratio of 1 to 1 and a pore ratio of 0.3, and the wavelengths are between 4 µm and 25 µm. Regarding boron nitride, a first valley of absorptance occurs at a wavelength range between 6 µm and 8 µm; and a second valley of absorptance occurs at a wavelength range between 12 µm and 13 µm. Regarding silicon dioxide, a first valley of absorptance occurs at a wavelength range between 8 µm and 10 µm; a second valley of absorptance occurs at a wavelength range between 20 µm and 21 µm. Regarding the mixture of boron nitride and silicon dioxide and taking the self-supporting having the pore ratio of 0.3 into consideration, and a calculation is made based on equivalent interface theory. It is found that the mixture of boron nitride and silicon dioxide can substantially eliminate the occurred valleys of absorptance of each of the first polar dielectric material unit 212 and the second polar dielectric material unit 213. As a result, absorptance of the surface of each of the above materials is greatly increased. It is possible to make a calculation of radiation power of a material at a high temperature based on the heat dissipation device of the invention and the material's absorption spectrum.

As shown in FIG. 5 again, the radiation power of boron nitride at 373 K is 860.14 W/m$^2$, the radiation power of silicon dioxide at 373 K is 830.59 W/m$^2$, and radiation power of the radiation power of the mixture of boron nitride and silicon dioxide at 373 K is greatly increased to 917.93 W/m$^2$. As described above, the mixture of boron nitride and silicon dioxide being used for manufacturing the composite heat dissipation device having a wide wavelength range of the invention.

Chemical compound of the first polar dielectric material unit 212 of the composite heat dissipation device 2 of the second preferred embodiment of the invention is, but not limited to, silicon nitride; and chemical compound of the second polar dielectric material unit 213 of the composite heat dissipation device 2 of the second preferred embodiment of the invention is, but not limited to, calcium sulfate.

Referring to FIG. 7, it is a table tabulating radiation powers ($P_{rad}$) of silicon nitride, calcium sulfate, and a mixture of silicon nitride and calcium sulfate of mixing ratio of 1 to 1 and pore ratio of 0.3 at 300 K, 330 K and 373 K respectively; and the mixture of silicon nitride and calcium sulfate being used for manufacturing the composite heat dissipation device having a wide wavelength range of the invention.

Figure 8:
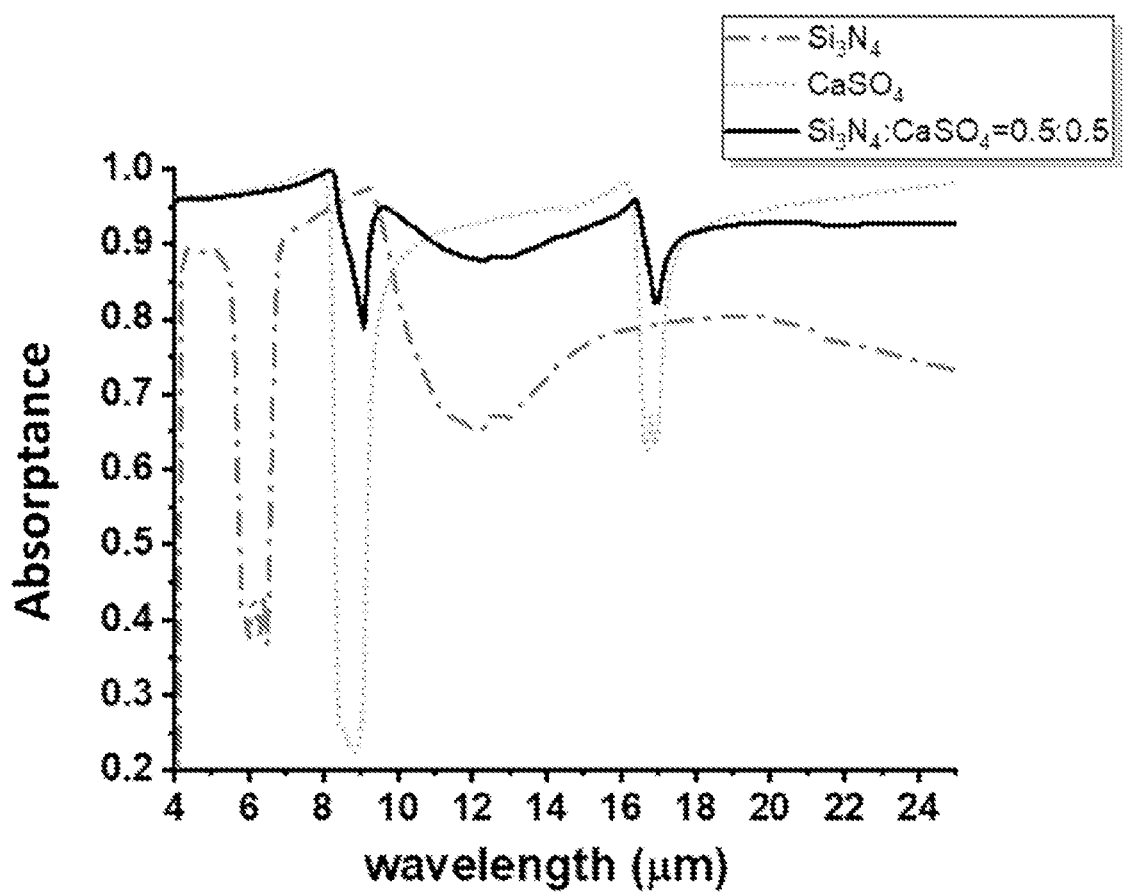
FIG. 8 is a chart showing absorptance versus wavelength for silicon nitride, calcium sulfate, and a mixture of silicon nitride and calcium sulfate respectively.

Referring to FIG. 8, it is a chart showing absorptance versus wavelength for silicon nitride, calcium sulfate, and a mixture of silicon nitride and calcium sulfate respectively in which the mixture of silicon nitride and calcium sulfate has a mixing ratio of 1 to 1 and a pore ratio of 0.3, and the wavelengths are between 4 μm and 25 μm. Regarding silicon nitride, a first valley of absorptance occurs at a wavelength range between 6 μm and 7 μm; and a second valley of absorptance occurs at a wavelength range between 10 μm and 14 μm. Regarding calcium sulfate, a first valley of absorptance occurs at a wavelength range between 8 μm and 9 μm; a second valley of absorptance occurs at a wavelength range between 16 μm and 18 μm. Regarding the mixture of silicon nitride and calcium sulfate and taking the self-supporting having the pore ratio of 0.3 into consideration, and a calculation is made based on equivalent interface theory. It is found that the mixture of silicon nitride and calcium sulfate can substantially eliminate the occurred valleys of absorptance of each of the first polar dielectric material unit 212 and the second polar dielectric material unit 213. As a result, absorptance of the surface of each of the above materials is greatly increased. It is possible to make a calculation of radiation power of a material at a high temperature based on the heat dissipation device of the invention and the material's absorption spectrum.

As shown in FIG. 7 again, the radiation power of silicon nitride at 373 K is 758.00 W/m$^2$, the radiation power of calcium sulfate at 373 K is 852.22 W/m$^2$, and the radiation power of the mixture of silicon nitride and calcium sulfate at 373 K is greatly increased to 902.36 W/m$^2$. As described above, the mixture of silicon nitride and calcium sulfate being used for manufacturing the composite heat dissipation device having a wide wavelength range of the invention.

Figure 9:
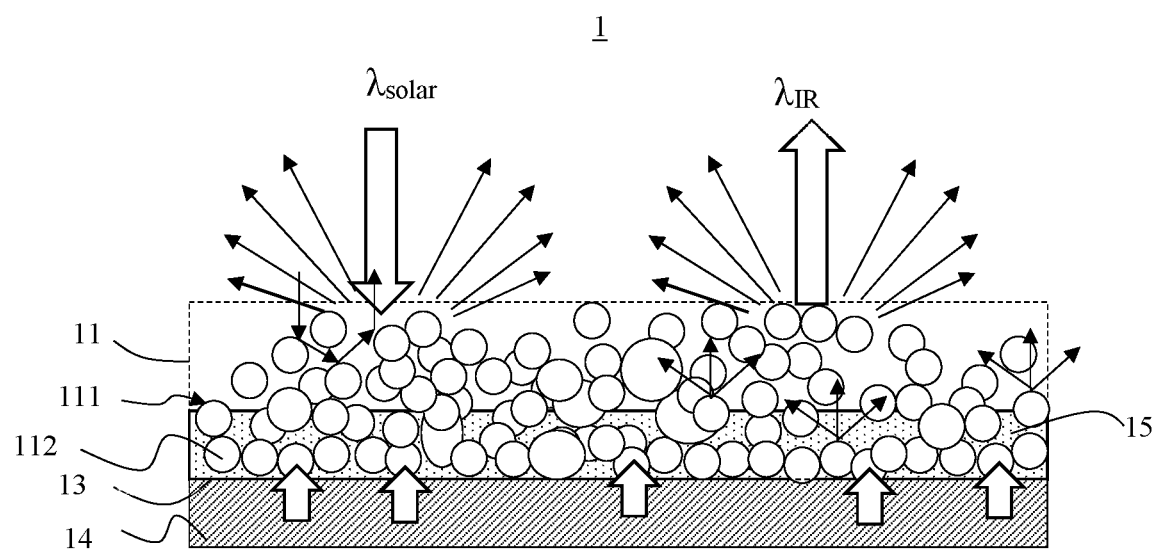
FIG. 9 is a cross-sectional view of a composite heat dissipation device according to a third preferred embodiment of the invention.

Referring to FIG. 9, it is a cross-sectional view of a composite heat dissipation device 3 according to a third preferred embodiment of the invention. The characteristics of the third preferred embodiment are substantially the same as that of the first preferred embodiment except the following: There is further provided a heat transfer layer 15 provided on the heat source 14. The heat transfer layer 15 fills gaps between the polar dielectric material assembly 111 and the heat source 14 and gaps among the polar dielectric material units 112 so as to increase heat transfer efficiency and decrease thermal resistance. The heat transfer layer 15 has a high conduction coefficient. It is possible to adjust viscosity, flowability and expandability of the heat transfer layer 15. The heat transfer layer 15 includes, but not limited to resin, silicone paste, silicone resin, heat transfer mud, silicone pad, heat transfer silicone cloth, heat transfer oil, heat transfer coating, plastics, heat transfer membrane, isolation membrane, isolator, interface material, double sided adhesive, heat transfer substrate, phase-changing material, heat transfer film, mica, pad, adhesive tape, and conduction metal pad. The heat transfer layer 15 has a thickness less than that of the polar dielectric material assembly 111 so that a surface of the polar dielectric material assembly 111 has a sufficient area for thermal radiation. It is understood that in other embodiments, a material having a high heat transfer coefficient can be used to fill the gaps so as to increase heat transfer efficiency and decrease thermal resistance.

In the invention, the polar dielectric material assembly includes the plurality of polar dielectric material units shaped as a pile having a self-supporting structure. Thus, support for the polar dielectric material assembly is not required. The composite heat dissipation device of the invention can be provided on an object for dissipating heat from the object. The heat dissipation performance is excellent. A process of preparing the composite heat dissipation device is performed at a temperature less than a melting point of the polar dielectric material units. The process comprises, but not limited to the steps of providing a polar dielectric material having one or more sub-wavelength structural particles; grinding the polar dielectric material into powder and mixing same; molding by selectively pressing the powder; removing a half-finished product from the mold; and heating the half-finish product at high temperature for a predetermined period of time until a product is produced. In an exemplary example, the process comprises, but not limited to the steps of providing zinc oxide particles having an average diameter of 559 nm, providing silicon dioxide particles having an average diameter of 542 nm, and aluminum oxide particles having an average diameter of 776 nm; grinding the polar dielectric material into powder and mixing same in a bowl; molding the mixture in a mold having a diameter of 2.54 cm by pressing the mixed powder with a pressure of 80 kg/cm$^3$ for two minutes; removing a half-finished product from the mold; and heating the half-finish product at 700-800° C. for 1-2 hours until a product is produced. The product has a thickness of hundreds micrometers to several millimeters. Preferably, the product has a thickness of 100 μm to 1000 μm. The polar dielectric material of the invention has a high melting point. The material thus can withstand high temperature for a long time. Further, a high radiation power is provided by the invention. It is understood that above measurements are for illustration only. The invention is not limited to the above measurements.

Thermal resistance of the polar dielectric material of the invention is expressed in watts per square meter kelvin (m$^2$*K/W) in SI unit, i.e., thermal insulance of a material. Thermal insulance means a temperature difference between two ends of an object with heat passing through the object per square meter kelvin. It can be calculated by dividing thickness of a material by thermal conductivity (W/m*K) of the material. Thermal insulance of typical insulating materials is greater than 0.1 m$^2$*K/W and thermal insulance of typical metal materials is between 1*10$^{-4}$ and 1*10$^{-5}$ m$^2$*K/W. In the invention, the polar dielectric material assembly includes the plurality of polar dielectric material units shaped as a pile having a self-supporting structure. Thermal conductivity of the polar dielectric material of the invention is between 0.5 and 10.0 W/m*K ad thermal insulance thereof is less than 5*10$^{-3}$ m$^2$*K/W.

The composite heat dissipation device of the invention comprises a polar dielectric material assembly including a plurality of sub-wavelength structural polar dielectric material units. The polar dielectric material unit includes an optical photon and an acoustic photon. With respect to radiative heat transfer, the invention is envisaged to control wavelength range of emissivity by means of structure and selecting the thermal radiation unit to from a single or composite material of the black body radiation wavelength range. Thus, either a narrow or wide wavelength range radiation body is selected to accommodate different heat dissipation requirements. Further, the polar dielectric material is advantageous due to strong mechanical properties, reliable ultraviolet, and high heat resistance. Thus, the polar dielectric material is without drawbacks of the conventional polymer for radiative heat transfer purposes. Differences of the polar dielectric material of the invention and the conventional polymer for radiative heat transfer purposes are detailed below. The conventional polymer may absorb ultraviolet of wavelength from 290 nm to 350 nm or infrared of wavelength from 1500 nm to 2500 nm. Thus, the conventional polymer cannot effectively decrease sunlight absorption, is subject to weathering, may absorb more sunlight due to excessive long periods of time exposed to ultraviolet, may be cracked, may have degraded mechanical properties, is not capable of withstanding temperature higher than 300° C., is not flameproof, and is not appropriate for buildings. To the contrast, the polar dielectric material of the invention can be mass produced, involves excellent technologies, can be easily molded, and is lightweight and inexpensive.

While the invention has been described in terms of preferred embodiments, those skilled in the art will recognize that the invention can be practiced with modifications within the spirit and scope of the appended claims.

What is claimed is:

1. A composite heat dissipation device, comprising:
an electromagnetic radiation dissipation pile including a polar dielectric material assembly including a plurality of polar dielectric material units;
wherein the polar dielectric material assembly is configured to interact with solar radiation, surfaces of the polar dielectric material units each are configured to interact with the solar radiation to generate scattering of light, and the polar dielectric material units each include an optical phonon configured to interact with thermal radiation to increase strength of the thermal radiation.

2. The composite heat dissipation device as claimed in claim 1, wherein the polar dielectric material units are sub-wavelength structures.

3. The composite heat dissipation device as claimed in claim 2, wherein the sub-wavelength structures are piled to form a self-supporting structure.

4. The composite heat dissipation device as claimed in claim 2, wherein the sub-wavelength structures are piled to form a porous structure including a plurality of pores, and wherein the solar radiation passes through the pores to interact with the polar dielectric material units.

5. The composite heat dissipation device as claimed in claim 2, wherein the sub-wavelength structures each include a plurality of nanoparticles.

6. The composite heat dissipation device as claimed in claim 1, wherein the polar dielectric material units each further comprise an acoustic phonon, and the acoustic phonons are configured to transfer heat therebetween.

7. The composite heat dissipation device as claimed in claim 6, further comprising a heat source with the electromagnetic radiation dissipation pile disposed thereon, and a heat transfer interface disposed between the electromagnetic radiation dissipation pile and the heat source, wherein heat produced by the heat source transfers to the electromagnetic radiation dissipation pile through the heat transfer interface.

8. The composite heat dissipation device as claimed in claim 7, wherein heat is transferred between the acoustic phonons, wherein the polar dielectric material units each further comprises an optical phonon, and wherein heat is further transferred from the acoustic phonons to the optical phonons for increasing strength of the thermal radiation.

9. A composite heat dissipation device, comprising:
an electromagnetic radiation dissipation pile including a polar dielectric material assembly including a plurality of first polar dielectric material units and a plurality of second polar dielectric material units;
wherein the first polar dielectric material units each includes a first optical phonon, the second polar dielectric material units each includes a second optical phonon, the first optical phonon has a resonant frequency different from that of the second optical phonon, the polar dielectric material assembly is configured to interact with solar irradiance, a first thermal radiation, and a second thermal radiation respectively, surfaces of the first and second polar dielectric material units each are configured to interact with the solar radiation to generate scattering of light, the first optical phonon is configured to interact with a first thermal radiation to increase strength of the first thermal radiation, and the second optical phonon is configured to interact with a second thermal radiation to increase strength of the second thermal radiation.

10. The composite heat dissipation device as claimed in claim 9, wherein the first and second polar dielectric material units are sub-wavelength structures.

11. The composite heat dissipation device as claimed in claim 10, wherein the sub-wavelength structures are piled to form a self-supporting structure.

12. The composite heat dissipation device as claimed in claim 10, wherein the sub-wavelength structures are piled to form a porous structure including a plurality of pores, and wherein the solar radiation passes through the pores to interact with the first and second polar dielectric material units.

13. A method of preparing the composite heat dissipation device as claimed in claim 1, the method comprising the steps of:
(a) providing a polar dielectric material;
(b) uniformly grinding the polar dielectric material into powder and mixing same;
(c) putting the mixed powder in a mold; and
(d) heating the mold at a temperature less than a melting point of the polar dielectric material until a product having a self-supporting structure is produced.

14. A method of preparing the composite heat dissipation device as claimed in claim 9, the method comprising the step of providing a plurality of first polar dielectric material units and a plurality of second polar dielectric material units wherein the first and second polar dielectric material units each are in black body radiation of wavelength range of spectrum, and wherein absorptance of the black body radiation of wavelength range of spectrum of the composite heat dissipation device is greater than that of each of the first and second polar dielectric material units.

* * * * *